(12) United States Patent
Lee et al.

(10) Patent No.: US 11,937,493 B2
(45) Date of Patent: Mar. 19, 2024

(54) DISPLAY DEVICE

(71) Applicant: SAMSUNG DISPLAY CO., LTD., Yongin-si (KR)

(72) Inventors: Joohyeon Lee, Suwon-si (KR); Jeoungsub Lee, Seoul (KR); Heonjung Shin, Gyeonggi-do (KR); Taehyeog Jung, Hwaseong-si (KR); Hyun Joon Oh, Seongnam-si (KR); Minhyuck Kang, Seoul (KR); Su-Hyoung Kang, Seoul (KR); Jeongeun Kim, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 413 days.

(21) Appl. No.: 17/159,854

(22) Filed: Jan. 27, 2021

(65) Prior Publication Data

US 2021/0249615 A1 Aug. 12, 2021

(30) Foreign Application Priority Data

Feb. 7, 2020 (KR) .................. 10-2020-0014914
Nov. 6, 2020 (KR) .................. 10-2020-0147856

(51) Int. Cl.
*H10K 77/10* (2023.01)
*B32B 7/022* (2019.01)
(Continued)

(52) U.S. Cl.
CPC ............ *H10K 77/111* (2023.02); *B32B 7/022* (2019.01); *B32B 7/12* (2013.01); *B32B 23/08* (2013.01); *B32B 23/20* (2013.01); *B32B 27/08* (2013.01); *B32B 27/281* (2013.01); *B32B 27/283* (2013.01); *B32B 27/285* (2013.01); *B32B 27/308* (2013.01); *B32B 27/34* (2013.01);
(Continued)

(58) Field of Classification Search
None
See application file for complete search history.

(56) References Cited

U.S. PATENT DOCUMENTS 10,522,782 B2 12/2019 Im et al.
2016/0014881 A1* 1/2016 Shin ............... G06F 1/1616
361/749

(Continued)

FOREIGN PATENT DOCUMENTS

CN 209199986 8/2019
KR 10-2018-0046424 5/2018

OTHER PUBLICATIONS

Examination Report dated Jul. 5, 2021 which corresponds to related European Application No. 21154908.4, 6 pages.

*Primary Examiner* — Ramsey Zacharia
(74) *Attorney, Agent, or Firm* — F. CHAU & ASSOCIATES, LLC

(57) ABSTRACT

Disclosed is a display device including a display module that has at least one folding area, a first film disposed on the display module and having a first modulus, a second film disposed on the first film, being farther from the display module than the first film, and having a second modulus less than the first modulus, and a third film disposed on the second film, being farther from the display module than the second film, and having a third modulus less than the second modulus. The third modulus is equal to or less than about one-sixth of the first modulus.

21 Claims, 8 Drawing Sheets

(51) Int. Cl.
| | |
|---|---|
| *B32B 7/12* | (2006.01) |
| *B32B 23/08* | (2006.01) |
| *B32B 23/20* | (2006.01) |
| *B32B 27/08* | (2006.01) |
| *B32B 27/28* | (2006.01) |
| *B32B 27/30* | (2006.01) |
| *B32B 27/34* | (2006.01) |
| *B32B 27/36* | (2006.01) |
| *B32B 27/40* | (2006.01) |
| *B60K 35/00* | (2006.01) |
| *G06F 1/16* | (2006.01) |
| *G09F 9/30* | (2006.01) |
| *H04M 1/02* | (2006.01) |
| *H10K 50/842* | (2023.01) |
| *H10K 50/844* | (2023.01) |
| *H10K 59/12* | (2023.01) |
| *H10K 59/124* | (2023.01) |
| *H10K 59/126* | (2023.01) |
| *H10K 59/40* | (2023.01) |
| *H10K 102/00* | (2023.01) |

(52) U.S. Cl.
CPC ............ *B32B 27/36* (2013.01); *B32B 27/365* (2013.01); *B32B 27/40* (2013.01); *H04M 1/0268* (2013.01); *H10K 59/12* (2023.02); *H10K 59/40* (2023.02); *B32B 2307/51* (2013.01); *B32B 2457/20* (2013.01); *H10K 2102/311* (2023.02)

(56) References Cited

U.S. PATENT DOCUMENTS

| | | | |
|---|---|---|---|
| 2016/0209550 A1* | 7/2016 | Jeong | ....................... G02B 1/14 |
| 2018/0063980 A1 | 3/2018 | Shin et al. | |
| 2018/0132370 A1 | 5/2018 | Choi et al. | |

\* cited by examiner

DISPLAY DEVICE

CROSS-REFERENCE TO RELATED APPLICATION

This U.S. nonprovisional application claims priority under 35 U.S.C. § 119 to Korean Patent Application No. 10-2020-0014914, filed on Feb. 7, 2020, and No. 10-2020-0147856, filed on Nov. 6, 2020, in the Korean Intellectual Property Office, the disclosure of which is incorporated by reference herein in its entirety.

TECHNICAL FIELD

The present disclosure relates to a display device with enhanced folding properties and increased impact resistance.

DISCUSSION OF RELATED ART

Display devices display various images on their display screens, for example, their allotted screens, to provide information to users. Flexible display devices have recently been developed, for example, for mobile devices to provide much larger screens, to include flexible display panels capable of being folded. Unlike rigid display devices, the flexible display devices may be foldable, rollable, stretchable, and/or bendable. The flexible display device, which is deformable into various shapes, can be carried out regardless of its existing screen size to thereby enhance user convenience. Besides flexibility, it is also desirable that the flexible display device has good impact resistance.

SUMMARY

Example embodiments of the present disclosure provide a display device with enhanced folding properties and increased impact resistance.

According to an example embodiment of the present disclosure, a display device may include: a display module that has at least one folding area; a first film disposed on the display module and having a first modulus; a second film disposed on the first film, being farther from the display module than the first film, and having a second modulus less than the first modulus; and a third film disposed on the second film, being farther from the display module than the second film, and having a third modulus less than the second modulus. The third modulus may be equal to or less than about one-sixth of the first modulus.

In an example embodiment of the present disclosure, the third modulus may be equal to or greater than about 1.5 percent and equal to or less than about 16.67 percent of the first modulus.

In an example embodiment of the present disclosure, the second modulus may be equal to or greater than about 50 percent and less than about 100 percent of the first modulus.

In an example embodiment of the present disclosure, the first film may be a composite material including one or more of polyimide (PI), aramid, glass fiber, glass chopped strand, and cellulose fiber.

In an example embodiment of the present disclosure, the second film may include polyethylene terephthalate (PET), acryl, polycarbonate (PC), polyethylene naphthalate (PEN), or triacetyl cellulose (TAC).

In an example embodiment of the present disclosure, the third film may include polyamide (PA), polymethylmethacrylate (PMMA), polyether block amide (PEBA)-based polymer, a silicone-based polymer, or a urethane-based polymer.

In an example embodiment of the present disclosure, a thickness of the third film may be greater than a thickness of the first film and a thickness of the second film. The thickness of the first film and the thickness of the second film may be the same as each other.

In an example embodiment of the present disclosure, the display device may further include: a first adhesive layer interposed between the display module and the first film; a second adhesive layer interposed between the first film and the second film; and a third adhesive layer interposed between the second film and the third film.

In an example embodiment of the present disclosure, a thickness of the first adhesive layer, a thickness of the second adhesive layer, and a thickness of the third adhesive layer may be the same as each other. A thickness of the third adhesive layer may be less than a thickness of the first adhesive layer and a thickness of the second adhesive layer.

In an example embodiment of the present disclosure, at a certain temperature, an adhesive force of the second adhesive layer may be less than an adhesive force of the first adhesive layer and an adhesive force of the third adhesive layer.

In an example embodiment of the present disclosure, the display device may further include: a fourth adhesive layer disposed below the display module; and a fourth film disposed below the fourth adhesive layer and having a fourth modulus less than the first modulus.

In an example embodiment of the present disclosure, the display device may further include: a fifth adhesive layer disposed below the fourth film; and a fifth film disposed below the fifth adhesive layer and having a fifth modulus less than the first modulus.

In an example embodiment of the present disclosure, the fifth modulus may be less than the fourth modulus. A thickness of the fifth film may be greater than a thickness of the fourth film.

In an example embodiment of the present disclosure, each of the first film and the second film may include a film that satisfies a condition that yield strain is about 1.9% to about 2.5%, plastic deformation index is about 0.58 to about 1, recovery rate is about 80% to about 100%, and strain rate is about 0% to about 30%.

In an example embodiment of the present disclosure, the third film includes a film that satisfies a condition that yield strain is about 1.9% to about 2.5%, plastic deformation index is about 0.58 to about 1, recovery rate is about 80% to about 100%, and strain rate is about 0% to about 100%.

According to an example embodiment of the present disclosure, a display device may include: a display module that has at least one folding area; a first film disposed on the display module and having a first modulus; a second film disposed on the first film, being farther from the display module than the first film, and having a second modulus different from the first modulus; a third film disposed on the second film, being farther from the display module than the second film, and having a third modulus different from the first modulus and the second modulus; a first adhesive layer interposed between the display module and the first film; a second adhesive layer interposed between the first film and the second film; and a third adhesive layer interposed between the second film and the third film. At a certain temperature, one or more of an adhesive force of the second adhesive layer and an adhesive force of the third adhesive layer may be less than an adhesive force of the first adhesive layer.

In an example embodiment of the present disclosure, the second modulus may be less than the first modulus. The second modulus may be greater than the third modulus. The third modulus may be equal to or greater than about 1.5 percent and equal to or less than about 16.67 percent of the first modulus.

In an example embodiment of the present disclosure, the display device may further include: a fourth film disposed below the display module and having a fourth modulus less than the first modulus; and a fifth film disposed below the fourth film and having a fifth modulus less than the fourth modulus. A thickness of the fifth film may be greater than a thickness of the fourth film.

In an example embodiment of the present disclosure, a thickness of the first film and a thickness of the second film may be the same as each other. A thickness of the third film may be greater than the thickness of the first film and the thickness of the second film.

In an example embodiment of the present disclosure, the first film may be a composite material including one or more of polyimide (PI), aramid, glass fiber, glass chopped strand, and cellulose fiber.

In an example embodiment of the present disclosure, the second film may include polyethylene terephthalate (PET), acryl, polycarbonate (PC), polyethylene naphthalate (PEN), or triacetyl cellulose (TAC).

In an example embodiment of the present disclosure, the third film may include polyamide (PA), polymethylmethacrylate (PMMA), polyether block amide (PEBA)-based polymer, a silicone-based polymer, or a urethane-based polymer.

In an example embodiment of the present disclosure, each of the first film and the second film may include a film that satisfies a condition that yield strain is about 1.9% to about 2.5%, plastic deformation index is about 0.58 to about 1, recovery rate is about 80% to about 100%, and strain rate is about 0% to about 30%.

In an example embodiment of the present disclosure, the third film may include a film that satisfies a condition that yield strain is about 1.9% to about 2.5%, plastic deformation index is about 0.58 to about 1, recovery rate is about 80% to about 100%, and strain rate is about 0% to about 100%.

BRIEF DESCRIPTION OF THE DRAWINGS

Example embodiments of the present disclosure will be more clearly understood from the following detailed description taken in conjunction with the accompanying drawings in which.

Figure 1A:
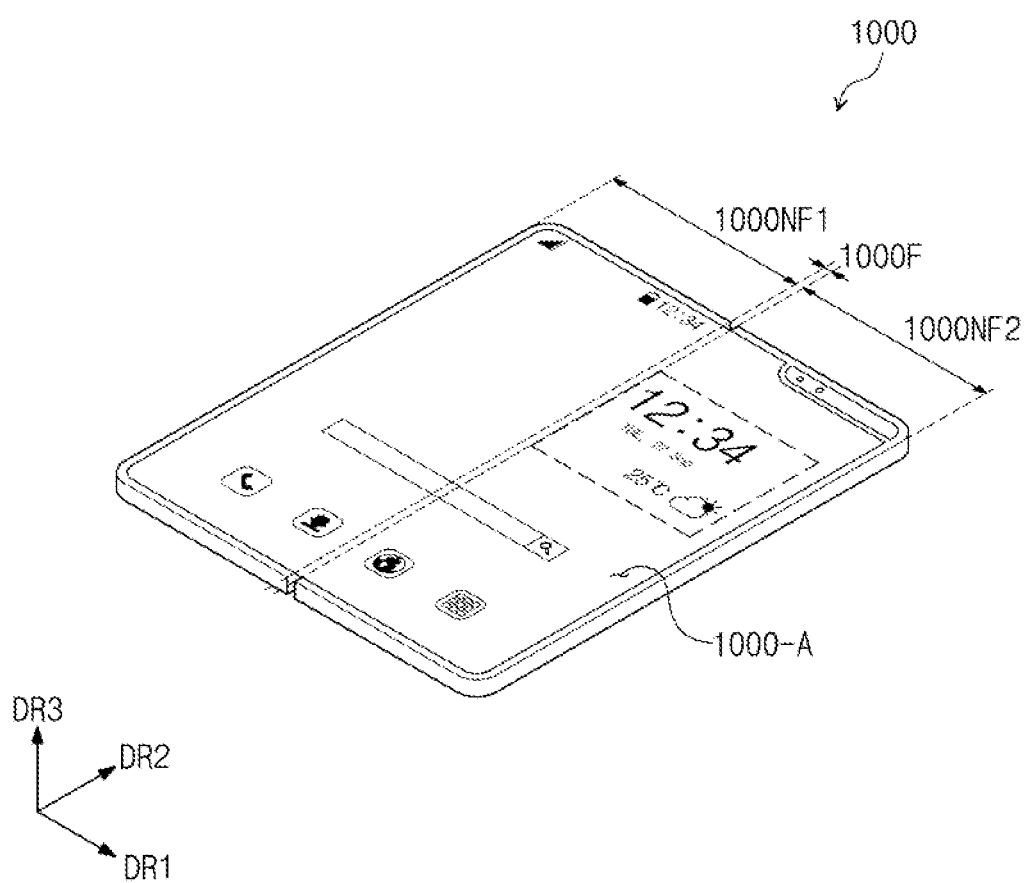
FIG. 1A illustrates a perspective view showing a display device according to an example embodiment of the present disclosure.

Since the drawings in FIGS. 1-6 are intended for illustrative purposes, the elements in the drawings are not necessarily drawn to scale. For example, some of the elements may be enlarged or exaggerated for clarity purpose.

DETAILED DESCRIPTION OF THE EMBODIMENTS

In this description, when a certain component (or region, layer, portion, etc.) is referred to as being "on", "connected to", or "coupled to" other component(s), the certain component may be directly disposed on, directly connected to, or directly coupled to the other component(s) or at least one intervening component may be interposed therebetween.

Like numerals refer to like components throughout.

The term "and/or" includes any and all combinations of one or more of the associated listed components.

It will be understood that, although the terms "first", "second", "third", etc. may be used herein to describe various components, but these components should not be limited by these terms. These terms are only used to distinguish one component from another component. For example, a first component could be termed a second component, and vice versa without departing from the scope of the present disclosure. Unless the context clearly indicates otherwise, the singular forms are intended to include the plural forms as well.

In addition, the terms "beneath", "lower", "above", "upper", and the like are used herein to describe one component's relationship to other component(s) illustrated in the drawings. These relative terms are intended to encompass different orientations of the device in use or operation, in addition to the orientation depicted in the drawings.

The term "about" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined, all terms used herein including technical and scientific terms have the same meaning as terms generally understood by one of ordinary skilled in the art to which the present disclosure belongs. Also, terms as defined in commonly used dictionaries should be understood as having meaning consistent with their meaning in the context of the relevant art and should not be understood as ideally or excessively formal meaning unless explicitly defined herein.

It should be understood that the terms "comprise", "include", "have", and the like are used to specify the presence of stated features, integers, steps, operations, components, elements, or combinations thereof, but do not preclude the presence or addition of one or more other features, integers, steps, operations, components, elements, or combinations thereof.

The following will now describe example embodiments of the present disclosure in conjunction with the accompanying drawings.

Figure 1B:
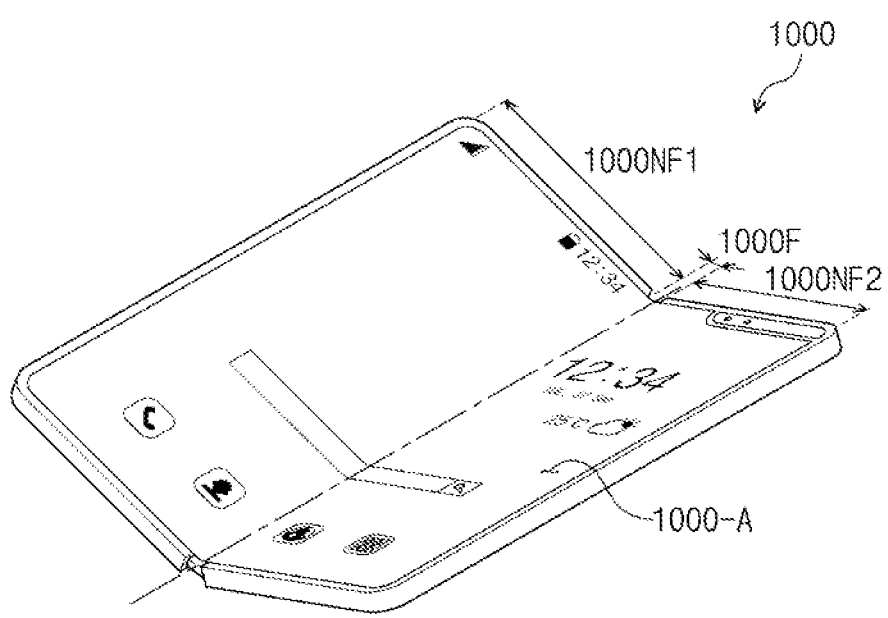
FIG. 1B illustrates a perspective view showing an operational state of a display device according to an example embodiment of the present disclosure.
Figure 1B:
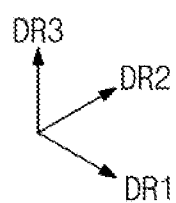

FIG. 1A illustrates a perspective view showing a display device according to an example embodiment of the present disclosure. FIG. 1B illustrates a perspective view showing an operational state of a display device according to an example embodiment of the present disclosure.

Referring to FIGS. 1A and 1B, a display device 1000 may be an apparatus that is activated by an electrical signal. For example, the display device 1000 may be a mobile phone, a tablet computer, an automotive navigation system, a game console, or a wearable apparatus such as a smart watch, but the present disclosure is not limited thereto. FIG. 1A exemplarily shows a mobile phone as an example of the display device 1000.

The display device 1000 may be a foldable display device. The display device 1000 may include a first unfolding area 1000NF1, a folding area 1000F, and a second unfolding area 1000NF2 that are sequentially defined along a first direction DR1. For example, the folding area 1000F may be defined between the first unfolding area 1000NF1 and the second unfolding area 1000NF2. The first unfolding area 1000NF1 and the second unfolding area 1000NF2 may each have one flat surface, and may not be folded or bent, while the folding area 1000F may have a flat surface located on a plane the same as that of the surfaces of the first unfolding area 1000NF1 and the second unfolding area 1000NF2 in an unfolded state, but it may be folded or bent to have a curved surface.

The display device 1000 may display an image on an active area 1000-A. In an unfolded state, the active area 1000-A may include a surface parallel to a plane defined by first and second directions DR1 and DR2. For example, the surface of the active area 1000-A may include display surfaces of the first unfolding area 1000NF1, the folding area 1000F, and the second unfolding area 1000NF2. A thickness direction of the display device 1000 may be parallel to a third direction DR3 that intersects the first and second directions DR1 and DR2. Therefore, the third direction DR3 may be used to distinguish front and rear surfaces (or top and bottom surfaces) of each component included in the display device 1000.

When the display device 1000 is folded, the first and second unfolding areas 1000NF1 and 1000NF2 may allow their display surfaces to face each other. Thus, the active area 1000-A may not be exposed when the display device 1000 is in a completely folded state. This may be referred to as in-folding. This, however, is only an example, and the present disclosure is not limited thereto.

When the display device 1000 is folded, the first and second unfolding areas 1000NF1 and 1000NF2 may allow their display surfaces to face in opposite directions away from each other, for example to face outward. Thus, in a folded state, the active area 1000-A may be externally exposed. This may be referred to as out-folding. The display device 1000 may become into in-folding or out-folding.

Figure 2A:
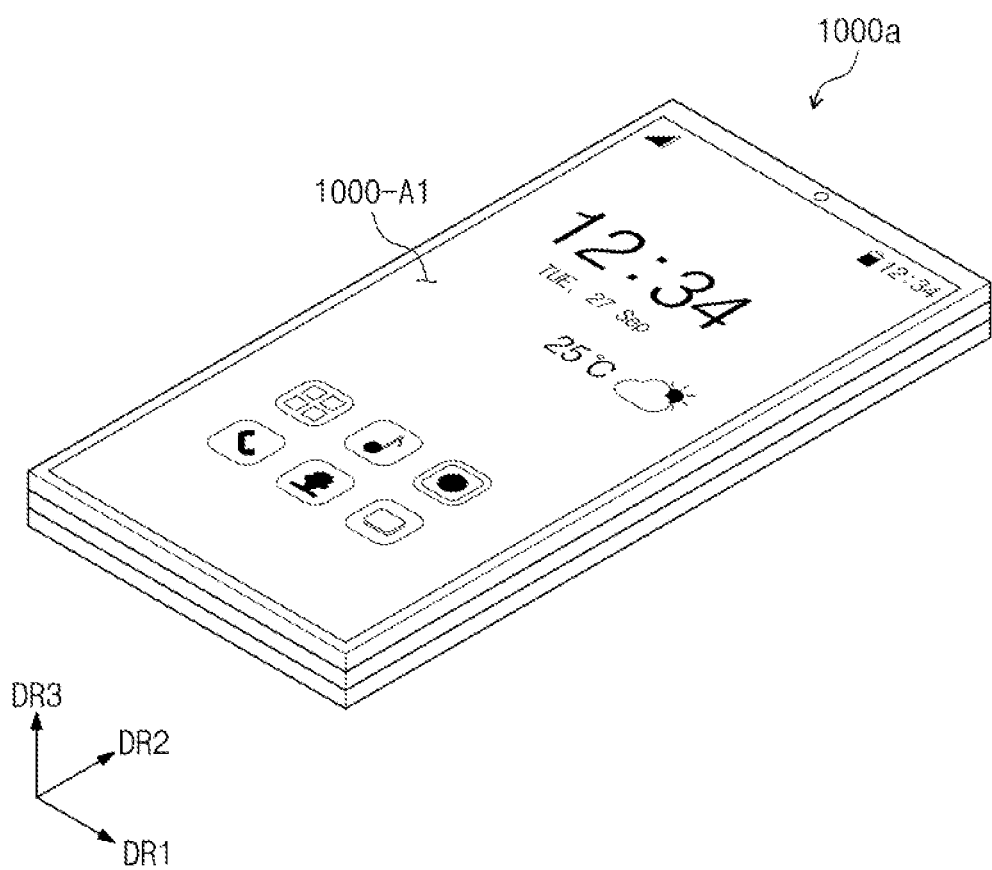
FIG. 2A illustrates a perspective view showing a display device according to an example embodiment of the present disclosure.
Figure 2B:
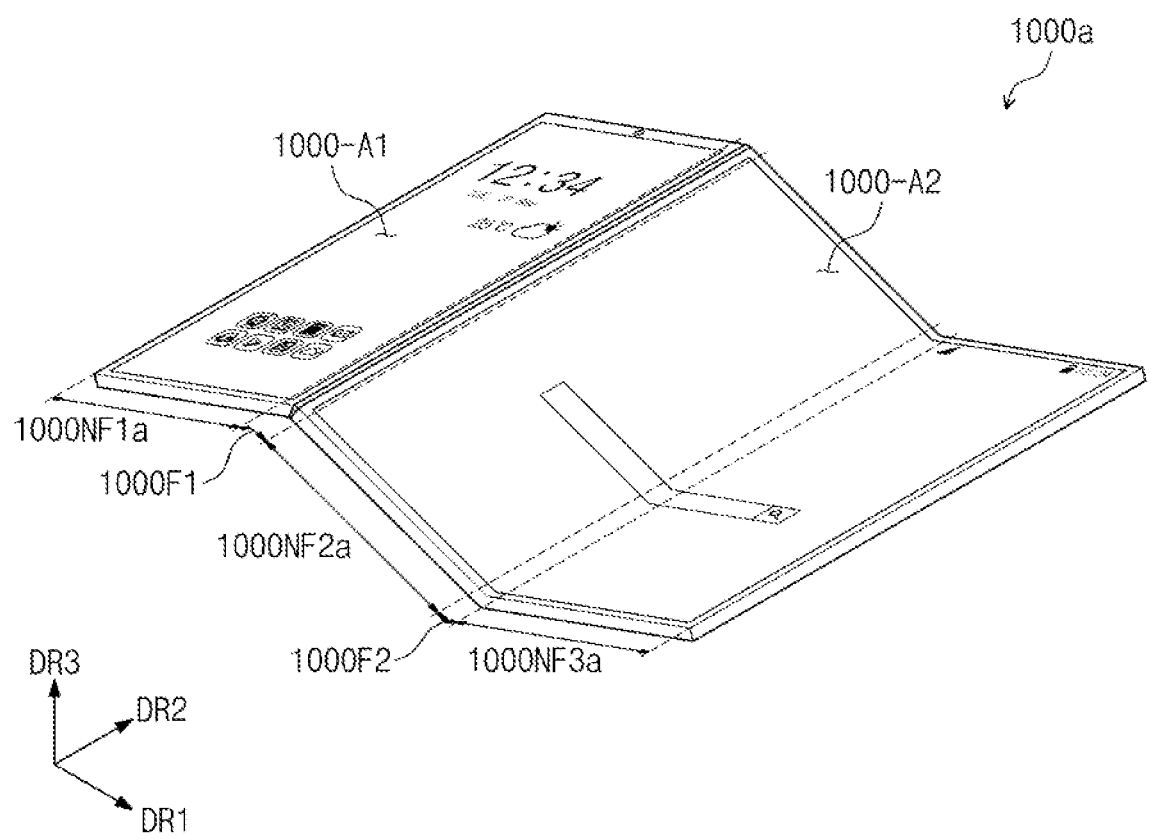
FIG. 2B illustrates a perspective view showing an operational state of a display device according to an example embodiment of the present disclosure.

FIG. 2A illustrates a perspective view showing a display device according to an example embodiment of the present disclosure. FIG. 2B illustrates a perspective view showing an operational state of a display device according to an example embodiment of the present disclosure.

Referring to FIGS. 2A and 2B, a display device 1000a may be a multi-foldable display device. The display device 1000a may include a first unfolding area 1000NF1a, a first folding area 1000F1, a second unfolding area 1000NF2a, a second folding area 1000F2, and a third unfolding area 1000NF3a that are sequentially defined along the first direction DR1. For example, the display device 1000a may include a plurality of folding areas 1000F1 and 1000F2. The first unfolding area 1000NF1a, the second unfolding area 1000NF2a and the third unfolding area 1000NF3a may each have a flat surface, and may not be folded or bent, while the first folding area 1000F1 and the second folding area 1000F2 may each have a flat surface located on a plane the same as that of the surfaces of the first unfolding area 1000NF1a, the second unfolding area 1000NF2a and the third unfolding area 1000NF3a in an unfolded state, but each may be folded or bent to have a curved surface.

The display device 1000a may display an image on first and second active areas 1000-A1 and 1000-A2. FIG. 2B shows an example in which the first active area 1000-A1 and the second active area 1000-A2 are discontinuous with each other, but the present disclosure is not limited thereto. For example, the first active area 1000-A1 and the second active area 1000-A2 may be continuous with each other.

A boundary between the first and second active areas 1000-A1 and 1000-A2 may overlap the first folding area 1000F1, and the second folding area 1000F2 may be defined on the second active area 1000-A2. The first folding area 1000F1 may be out-folded, and the second folding area 1000F2 may be in-folded. Thus, when the display device 1000a is folded, the second and third unfolding areas 1000NF2a and 1000NF3a may allow their display surfaces to face each other, while the display surface of the first unfolding area 1000NF1a may face outward. Thus, the second active area 1000-A2 may not be exposed when the display device 1000a is in a completely folded state, while the first active area 1000-A1 is exposed.

As illustrated in FIG. 1B and described above, the display device 1000 may be a foldable display device including a folding area 1000F defined between a first unfolding area 1000NF1 and a second unfolding area 1000NF2. Also as illustrated in FIG. 2B and described above, the display device 1000a may be a multi-foldable display device including a plurality of folding areas 1000F1 and 1000F2. The display module 100 may include at least one folding area, for example the one folding area 1000F in display device 1000, or the plurality of folding areas 1000F1 and 1000F2 in the display device 1000a.

Figure 3:
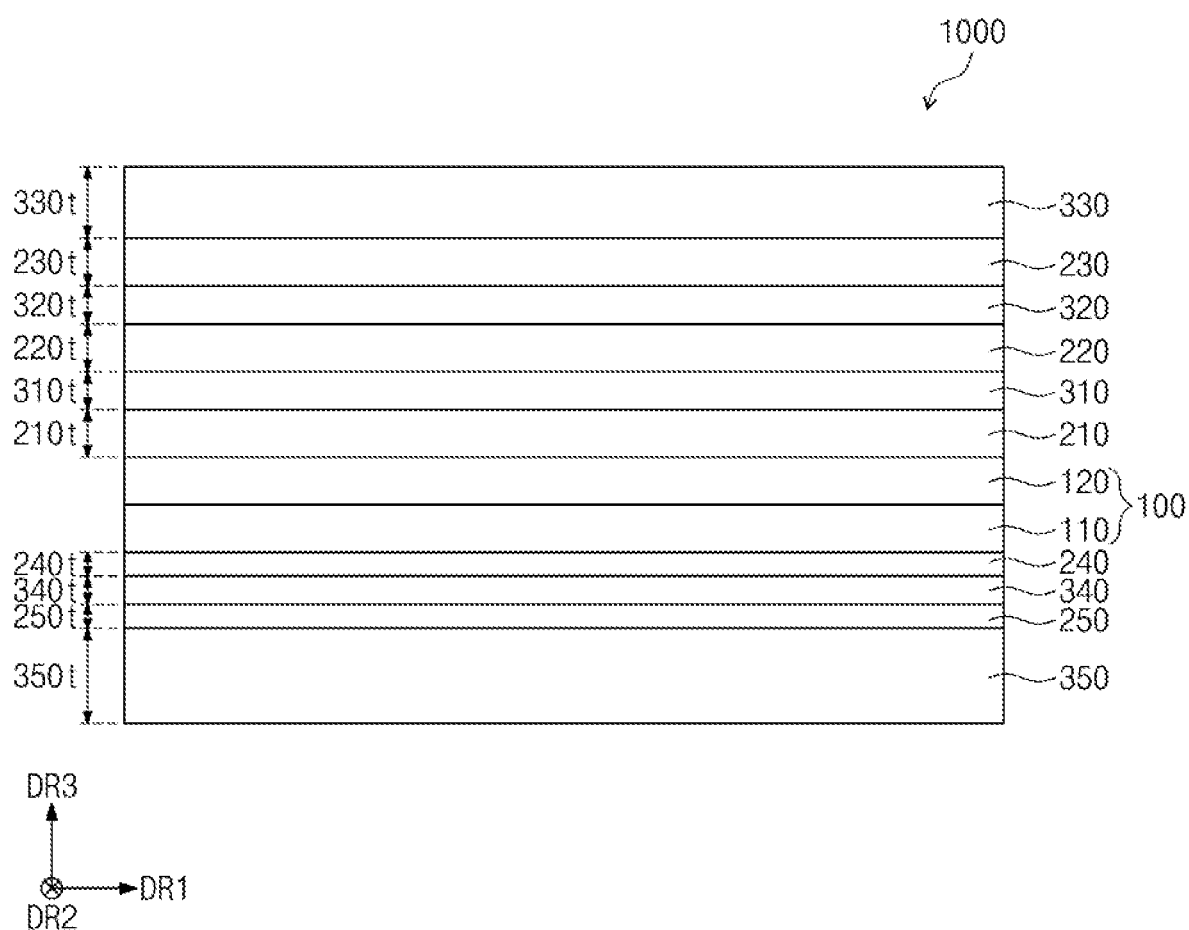
FIG. 3 illustrates a cross-sectional view showing a display device according to an example embodiment of the present disclosure.

FIG. 3 illustrates a cross-sectional view showing a display device according to an example embodiment of the present disclosure.

Referring to FIG. 3, the display device 1000 may include a display module 100, first, second, third, fourth, and fifth adhesive layers 210, 220, 230, 240, and 250, and first, second, third, fourth, and fifth films 310, 320, 330, 340, and 350.

The display module 100 may display an image and may detect an external input. The external input may be a user's input. The user's input may include, for example, a user's body part, light, heat, pen, pressure, or various other types of external input.

The display module 100 may include a display panel 110 that generates the image and an input sensor 120 that obtains coordinate information of the external input.

The display panel 110 may be, but not limited to, an emissive display panel. For example, the display panel 110 may be an organic light emitting display panel or a quantum-dot light emitting display panel. An emission layer of the organic light emitting display panel may include an organic light emitting material. An emission layer of the quantum-dot light emitting display panel may include a quantum-dot or a quantum-rod.

The input sensor 120 may be disposed on the display panel 110. The input sensor 120 may detect the external input in a mutual capacitance method or a self-capacitance method. For example, the input sensor 120 may obtain information on the external input through a change in capacitance between two sensing electrodes. The external input detection method, however, is not limited to the example mentioned above.

The first adhesive layer 210 may be disposed on the display module 100. The first film 310 may be disposed on the first adhesive layer 210. For example, the first film 310 may be disposed on the display module 100, with the first adhesive layer 210 interposed therebetween to bond the first film 310 to the display module 100. The second adhesive layer 220 may be disposed on the first film 310. The second film 320 may be disposed on the second adhesive layer 220. For example, the second film 320 may be disposed on the first film 310, with the second adhesive layer 220 interposed therebetween to bond the second film 320 to the first film 310. The third adhesive layer 230 may be disposed on the second film 320. The third film 330 may be disposed on the third adhesive layer 230. For example, the third film 330 may be disposed on the second film 320, with the third adhesive layer 230 interposed therebetween to bond the third film 330 to the second film 320. The second film 320 may be farther from the display module 100 than the first film 310, and the third film 330 may be farther from the display module 100 than the second film 320. Thus, the third film 330 may have the longest distance from the display module 100 among the first second and third films 310, 320 and 330. Each of the first, second, and third films 310, 320, and 330 may have a transmittance of equal to or greater than about 85%, for example, about 90% or more, a haze value of equal to or less than about 3%, for example, about 1% or less, and a yellow index (YI) of equal to or less than about 2.

The fourth adhesive layer 240 may be disposed below the display module 100. The fourth film 340 may be disposed below the fourth adhesive layer 240. The fourth adhesive layer 240 may bond the fourth film 340 to the display module 100. The fourth film 340 may be a protective film that protects a bottom surface of the display module 100, and may be, for example, a colored polyimide (PI) film. The fifth adhesive layer 250 may be disposed below the fourth film 340. The fifth film 350 may be disposed below the fifth adhesive layer 250. The fifth adhesive layer 250 may bond the fifth film 350 to the fourth film 340. The fifth film 350 may be a protective film that protects the bottom surface of the display module 100, and may be a cushion layer including, for example, a sponge, a foam, or a urethane resin.

The first, second, and third films 310, 320, and 330 may have their moduli that decrease with increasing distance from the display module 100. For example, the first film 310 may have a first modulus, the second film 320 may have a second modulus, and the third film 330 may have a third modulus. The second modulus may be less than the first modulus, and the third modulus may be less than the second modulus. For example, the first modulus may range from about 6,500 MPa to about 10,000 MPa, the second modulus may range from about 3,500 MPa to about 5,000 MPa, and the third modulus may range from about 600 MPa to about 1,000 MPa.

The fourth film 340 may have a fourth modulus, and the fifth film 350 may have a fifth modulus. The fourth modulus may be less than the first modulus, and the fifth modulus may be less than the fourth modulus. For example, the fifth modulus may be less than the first modulus.

In this description, the language "modulus" may be a value measured by a universal test machine (UTM) in which a specimen of about 10 mm width and a gauge length of about 50 mm are used. For example, the word "modulus" may be a value obtained at about 0.025% to about 0.5% of a stress-strain curve for the specimen gauged in the universal test machine. The term "modulus" used herein throughout the specification and the claims may also be called elastic coefficient, Young's modulus, elastic constant, or elastic modulus.

The first film 310 may be a composite material including one or more of, for example, polyimide (PI), aramid, glass fiber, glass chopped strand, and cellulose fiber, and thus may have high modulus.

The second film 320 may include, for example, polyethylene terephthalate (PET), acryl, polycarbonate (PC), polyethylene naphthalate (PEN), or triacetyl cellulose (TAC), and thus may have middle modulus. For example, the second film 320 may have a modulus lower than that of the first film 310. When the second film 320 includes polyethylene terephthalate (PET) or polyethylene naphthalate (PEN), an extrusion process may be used to control the modulus along a machine direction and a transverse direction. When the second film 320 includes polycarbonate (PC) or triacetyl cellulose (TAC), a casting process may be employed to form the second film 320.

The third film 330 may include, for example, polyamide (PA), polymethylmethacrylate (PMMA), polyether block amide (PEBA)-based polymer, a silicone-based polymer, or a urethane-based polymer, and thus may have low modulus. For example, the third film 330 may have a modulus lower than that of the second film 320. In an example embodiment of the present disclosure, the third film 330 may include an elastomer to provide low modulus.

A polyether block amide (PEBA)-based polymer is a block copolymer in which a soft part includes polyether segment and a rigid part includes polyamide block.

When the third film 330 includes a polyether block amide (PEBA)-based polymer, the modulus of the third film 330 may be adjusted by a ratio between the soft part and the rigid part.

A urethane-based polymer may include polyol, isocyanate, and a chain extender. Polyol may include one or more of, for example, polyether, polyester, polycarbonate, polybutadiene, and acryl. Isocyanate may include one or more of, for example, methylene diphenyl diisocyanate (MDI), hexamethylene diisocyanate (HDI), isophorone diisocyanate (IPDI), and 1,4-cyclohexane diisocyanate (CDI). The chain extender may include one or more of, for example, diol, diamine, triol, tetraol, and aminoalcohol.

When the third film 330 includes a urethane-based polymer, the modulus of the third film 330 may be adjusted by a ratio between polyol, isocyanate, and the chain extender.

A silicone-based polymer may be polydimethylsiloxane, which is a linear polymer. When the third film 330 includes a silicone-based polymer, the modulus of the third film 330 may be adjusted based on the degree of entanglement in a molecular structure of the linear polymer.

Table 1 below lists the moduli of the second and third films 320 and 330, which moduli satisfy a minimum strain condition and a buckling count criterion when the first modulus of the first film 310 is about 6 GPa. The moduli listed in the following Table 1 satisfy the minimum strain condition in each of simulations executed three times. Although about 6 GPA for the first modulus of the first film 310 is used in the simulations, any other suitable high modulus may be used for the first film 310. For example, in an example embodiment of the present disclosure, the first modulus of the first film 310 may be in a range from about 5 GPa to about 10 GPa.

It may be considered that the minimum strain condition is satisfied when a variation in length is less than about 2%, and it may be considered that the buckling count criterion is satisfied when the number of buckling is less than about 20.

Referring to Table 1, when the first modulus of the film 310 is about 6 GPa, the minimum strain condition and the buckling count criterion may all be satisfied when the modulus of the second film 320 is in a range from about 3.5 GPa to about 5 GPa and when the modulus of the third film 330 is in a range of about 1 GPa or less.

TABLE 1

|  | Modulus of second film 320 | Modulus of third film 330 |
| --- | --- | --- |
| Modulus satisfied with minimum strain condition | 3.5 GPa~5 GPa<br>2 GPa~4 GPa<br>3 GPa or less | 1 GPa or less<br>2 GPa or less<br>2 GPa or less |
| Modulus satisfied with buckling count criterion | 3.5 GPa or more | 2.5 GPa or less, or 3.5 GPa~4.5 GPa |

Table 2 below lists whether a strain condition and a flexibility test are satisfied or not based on the modulus of the third film 330 and a thickness of each of the first, second, and third films 310, 320, and 330. Comparatives show test results when the modulus of the first film 310 is about 6 GPa, the modulus of the second film 320 is about 4 GPa, and the modulus of the third film 330 is about 1.4 GPa. The modulus of the third film 330 according to Comparatives may be about 23.33% of the modulus of the first film 310. As shown in Table 2, Comparatives do not satisfy both the minimum strain condition and the flexibility test. Embodiments show test results when the modulus of the first film 310 is about 6 GPa, the modulus of the second film 320 is about 4 GPa, and the modulus of the third film 330 is about 800 MPa. The modulus of the third film 330 according to Embodiments may be about 13.33% of the modulus of the first film 310. As shown in Table 2, Embodiments satisfy both the minimum strain condition and the flexibility test.

TABLE 2

|  | Thickness of first film 310 (μm) | Thickness of second film 320 (μm) | Thickness of third film 330 (μm) | Whether strain condition is satisfied or not (film not satisfied with minimum strain condition) | Whether flexibility test is satisfied or not |
| --- | --- | --- | --- | --- | --- |
| Comparatives | 40 | 50 | 50 | NG (second film) | — |
|  | 30 | 50 | 50 | NG (second film) | — |
|  | 40 | 40 | 50 | NG (first film) | — |
|  | 30 | 40 | 50 | OK | NG |
|  | 40 | 40 | 60 | OK | NG |
|  | 30 | 50 | 60 | NG (second film) | — |
| Embodiments | 40 | 40 | 50 | OK | OK |
|  | 40 | 40 | 75 | OK | OK |
|  | 40 | 40 | 100 | OK | OK |

According to an example embodiment of the present disclosure, the second and third moduli may be determined so as to satisfy the minimum strain condition and the buckling count criterion. For example, the second modulus may be equal to or greater than about 50 percent and less than about 100 percent of the first modulus, and the third modulus may be equal to or greater than about 1.5 percent and equal to or less than about 16.67 percent of the first modulus. In an example embodiment of the present disclosure, the third modulus may be equal to or less than about one-sixth of the first modulus. For example, when the first modulus is about 6.5 GPa, the second modulus may be equal to or greater than about 3.5 GPa and less about 6.5 GPa, and the third modulus may be from about 0.1 GPa to about 1.08 GPa. For example, when the first modulus is about 7 GPa, the third modulus may be about 1.2 GPa or less, or from about 0.11 GPa to about 1.17 GPa.

When the third modulus is greater than about 16.67 percent of the first modulus, the display device 1000 may not satisfy the minimum strain condition or the flexibility test.

The fourth modulus may be about 30 percent of the first modulus, and the fifth modulus may be about 1.5 percent of the first modulus. The fourth modulus may be equal to or less than about 2 GPa, and the fifth modulus may be equal to or less than about 0.1 GPa. The moduli of the fourth and fifth films 340 and 350 below the display module 100 may decrease with increasing distance from the display module 100. The fourth film 340 and the fifth film 350 may be protective films that protect the bottom surface of the display module 100. In addition, according to an example embodiment of the present disclosure, the fifth film 350 whose modulus is low may be disposed at an outer position such that even when the fifth film 350 is deformed in thickness, flexibility properties may be enhanced due to a reduction in shape variation (e.g., thickness variation) of another layer adjacent to the fifth film 350.

Each of the first, second, third, fourth, and fifth adhesive layers 210, 220, 230, 240, and 250 may include an ordinary adhesive or glue. For example, each of the first, second, third, fourth, and fifth adhesive layers 210, 220, 230, 240, and 250 may be a transparent adhesive member, such as, for example, a pressure sensitive adhesive (PSA) film, an optically clear adhesive (OCA) film, or an optically clear resin (OCR).

The first, second, third, fourth, and fifth adhesive layers 210, 220, 230, 240, and 250 may include their adhesives or glues of the same physical properties. Alternatively, at least one of the first, second, third, fourth, or fifth adhesive layers 210, 220, 230, 240, or 250 may have different physical properties from those of other adhesive layers. For example, at least one of the first, second, third, fourth, or fifth adhesive layers 210, 220, 230, 240, or 250 may have a different adhesive force from those of other adhesive layers.

In an example embodiment of the present disclosure, at a certain temperature, the second adhesive layer 220 may have an adhesive force less than those of the other adhesive layers 210, 230, 240, and 250. Here, the certain temperature is a temperature used in a rework process. Depending on the rework process used, it is usually at an elevated temperature, but not at a temperature too high to damage the device being reworked. In this case, when a rework process is performed, the second film 320, the third adhesive layer 230, and the third film 330 that are components disposed on the second adhesive layer 220 may be easily separated from the first film 310. Alternatively, at a certain temperature, the third adhesive layer 230 may have an adhesive force less than those of the other adhesive layers 210, 220, 240, and 250. In this case, when a rework process is performed, the third film 330 that is a component disposed on the third adhesive layer 230 may be easily separated from the second film 320. In addition, at a certain temperature, both the second adhesive layer 220 and the third adhesive layer 230 may each have an adhesive force less than those of the other adhesive layers 210, 240, and 250. In this case, when a rework process is performed, the second film 320 may be easily separated from the first film 310 and/or the third film 330 may be easily separated from the second film 320. In an example embodiment of the present disclosure, at a certain temperature, one or more of an adhesive force of the second adhesive layer 220 and an adhesive force of the third adhesive layer 230 may be less than an adhesive force of the first adhesive layer 210.

Although a rework process is performed, the first film 310 may not be separated from the display module 100, because the adhesive force of the first adhesive layer 210 is greater than that of the second adhesive layer 220 and that of the third adhesive layer 230. Accordingly, the first film 310 may protect the display module 100 even during a rework process.

The first, second, and third adhesive layers 210, 220, and 230 may respectively have first, second, and third thicknesses 210t, 220t, and 230t that are the same as each other. For example, the first, second, and third thicknesses 210t, 220t, and 230t may each be about 50 m. The fourth and fifth adhesive layers 240 and 250 may respectively have fourth and fifth thicknesses 240t and 250t each of which is less than any of the first, second, and third thicknesses 210t, 220t, and 230t. For example, the fourth and fifth thicknesses 240t and 250t may each be about 25 m. Alternatively, the first thickness 210t of the first adhesive layer 210 may be different from the second, and third thicknesses 220t, and 230t of the second, and third adhesive layers 220, and 230. For example, each of the first and second thicknesses 210t and 220t may be about 50 μm, and the third thickness 230t may be about 25 μm (see FIG. 5).

The first film 310 may have a first thickness 310t the same as a second thickness 320t of the second film 320. For example, the first and second thicknesses 310t and 320t may each be equal to or less than about 40 m, for example, about 40 m. The third film 330 may have a third thickness 330t greater than each of the first and second thicknesses 310t and 320t. For example, the third thickness 330t may be in a range from about 50 m to about 100 m, for example, about 75 m.

According to an example embodiment of the present disclosure, since the third film 330, whose modulus is the smallest among the first to third films 310 to 330, has the third thickness 330t larger than all the other thicknesses of different layers, it may be possible to increase impact resistance with no reduction in flexibility properties.

Differently from the example embodiments of the present disclosure, in a case where the third film 330 is disposed between the first film 310 and the second film 320, two adhesive layers in contact with the third film 330 may be deformed in thickness when the display device 1000 is folded and then the third film 330 is changed in thickness. This may induce failure such as wrinkles, and the wrinkles may be visible to users. In contrast, according to an example embodiment of the present disclosure, the third film 330 whose modulus is low may be disposed at an outer position such that even when the third film 330 is deformed in thickness, flexibility properties may be enhanced due to a reduction in shape variation (e.g., thickness variation) of another layer adjacent to the third film 330.

The fourth thickness 340t of the fourth film 340 may be less than the first thickness 310t. For example, the fourth thickness 340t may be about 25 μm. For example, the fourth thickness 340t may be about 30 μm. The fifth thickness 350t of the fifth film 350 may be greater than the fourth thickness 340t. For example, the fifth thickness 350t may be about 100 μm. The fifth film 350 may have lower modulus and greater thickness located at an outer lower position of the display device 1000 to protect the bottom surface of the display module 100 without reduction in flexibility properties.

According to an example embodiment of the present disclosure, at least three films, such as the first, second, and third films 310, 320, and 330, may be disposed on the display module 100 and thus impact resistance may thus increase. In addition, the moduli of the first, second, and third films 310, 320, and 330 may gradually decrease with increasing distance from the display module 100. Accordingly, the display device 1000 may enhance in folding properties. In this description, the expression "enhance in folding properties" may mean that the display device 1000 is foldable with a small radius of curvature.

According to an example embodiment of the present disclosure, an increase in physical properties of the first, second, and third films 310, 320, and 330 may enhance surface impression and shape deformation. The physical properties may include, for example, modulus, yield strain, plastic deformation index, recovery rate, and strain rate.

The physical properties of the first, second, and third films 310, 320, and 330 may be changed by controlling temperature, humidity, and/or time. For example, the physical properties may be controlled by controlling humidity and time at a temperature equal to or greater than a glass transition temperature (Tg) of each of the first, second, and third films 310, 320, and 330.

Table 3 below lists physical property changes caused by control of temperature, humidity, and time of each of the first, second, and third films 310, 320, and 330.

TABLE 3

| Film | Temperature, humidy, and time control | Physical properties | | | | |
|---|---|---|---|---|---|---|
| | | Modulus (MPa) | Yield strain (%) | Plastic deformation index | Recovery rate (%) | Strain rate (%) |
| First film (A) | — | 6064 | 2.0 | 0.58 | 93.3 | 19 |
| Second film (B) | — | 4723 | 1.9 | 0.57 | 94.0 | 58 |
| Third film (C) | — | 754 | 2.0 | 0.67 | 74.5 | 486 |
| First film (A') | 70° C., 40% + 4 days or more | 6263 | 2.1 | 0.67 | 94.9 | 11 |
| Second film (B') | 70° C., 90% + 4 days or more | 4680 | 2.2 | 0.66 | 95.4 | 21 |

TABLE 3-continued

| Film | Temperature, humidy, and time control | Physical properties | | | | |
|---|---|---|---|---|---|---|
| | | Modulus (MPa) | Yield strain (%) | Plastic deformation index | Recovery rate (%) | Strain rate (%) |
| Third film (C') | 50° C., 40% + 4 days or more | 866 | 2.1 | 0.68 | 82.0 | 96 |

The yield strain may mean a point at which a film reaches the limit of elastic behavior and the beginning of plastic behavior. The plastic deformation index may be defined as a ratio between elastic and plastic moduli. For example, the plastic modulus may be defined as a modulus at a point at which a film exceeds the elastic limit, for example, a modulus at a point of about 2.5% or at a point of from about 2.25% to about 2.75%. The recovery rate may mean a proportional value that denotes the degree of recovery of a film after yield strain and cycle estimation. The cycle estimation may mean that, for example, a film repeatedly folds and unfolds at several thousand times or several tens of thousand times in a single cycle per seconds. The stain rate may mean a proportional value that expresses the degree of extension of a film when the film is pulled with a constant strain for specific time duration.

A commonly used measurement apparatus may be employed to measure the modulus, the yield strain, the plastic deformation index, the recovery rate, and the strain rate. For example, a universal testing machine (UTM) may be used to measure the physical properties.

One or both of the first film 310 and the second film 320 may include a film whose yield strain is about 1.9% to about 2.5%, whose plastic deformation index is about 0.58 to about 1, whose recovery rate is about 80% to about 100%, and whose strain rate is about 0% to about 30%, and the third film 330 may include a film whose yield strain is about 1.9% to about 2.5%, whose plastic deformation index is about 0.58 to about 1, whose recovery rate is about 80% to about 100%, and whose strain rate is about 0% to about 100%. As the third film 330 has a modulus less than those of the first and second films 310 and 320, the third film 330 may include a film whose strain rate is high. In Table 3 above, the first film (A), the first film (A'), and the second film (B') may be films that satisfy specific physical properties.

Table 4 below lists module properties under a state where the first, second, and third films 310, 320, and 330 are attached to the display module 100. Comparatives express combined examples that fail to pass tests, and Embodiments express combined examples that pass tests.

TABLE 4

| | Combination of first, second, and third films | Impression (gf) | First deformation angle (°) | Second deformation angle (°) | Wrinkle depth (μm) | State |
|---|---|---|---|---|---|---|
| Comparatives | A/B/C | 1900 | 43 | 18 | 24.1 | NG |
| | A/B'/C | 1900 | 43 | 18 | 23.8 | NG |
| | A/B/C' | 2200 | 39 | 13 | 21.5 | NG |
| Embodiments | A'/B'/C' | 2600 | 26 | 7 | 18.9 | OK |
| | A/B'/C' | 2400 | 30 | 9 | 19.7 | OK |

The impression may be evaluation for testing defects caused by impression of a surface of the display device 1000. For example, an artificial nail jig may press a specific load on a surface of the display device 1000 to determine whether the display device 1000 has defects or not. The values listed in Table 4 may mean a minimum load that begins to visually identify impression defects. It may be estimated that high reliability is achieved by an increase in the minimum load from which impression defects are visible. A reference value for good products over impression defects may be equal to or greater than about 2,000 gf (gram force), for example, about 2,400 gf or higher.

The deformation angle may be measured from an unfolding state of the display device 1000 that has been left in a folding state for specific time duration under certain conditions after the display device 1000 folds. For example, the certain conditions may be room humidity at room temperature or high humidity at high temperature.

The display device 1000 may become a folding state so as to have a curvature radius of about 1 mm, and the specific time duration is about 24 hours. The room temperature may be about 25 degrees centigrade, the room humidity may be about 40 percent humidity, the high temperature may be about 60 degrees centigrade, and the high humidity may be about 90 percent humidity.

The deformation angle may be defined as an angle between a reference plane and a floated plane of the display device 1000. For example, when the deformation angle is zero, the display device 1000 may be meant to have a fully flat state. When the deformation angle approaches zero, properties of the deformation angle may be estimated to be excellent.

The first deformation angle may mean an angle when the display device 1000 unfolds, and may be called an instant deformation angle. A good product reference value for the first deformation angle may be equal to or less than about 45 degrees.

The second deformation angle may mean an angle measured from an unfolding state of the display device 1000 that has been left in the unfolding state for specific time duration, for example, for about 24 hours, after unfolding a folded display device 1000. The second deformation angle may be called a permanent deformation angle. A good product reference value for the second deformation angle may be equal to or less than about 18 degrees, for example, about 10 degrees or less.

The wrinkle depth may be obtained from an optical apparatus that measures a depth of wrinkles that occur on the folding area (see 1000F of FIG. 1A). For example, the wrinkle depth may be measured depth of wrinkles that occur after the display device 1000 maintains its folding state for specific time duration under certain conditions. The certain conditions may be room humidity at room temperature or high humidity at high temperature.

For example, the wrinkle depth may be measured depth of wrinkles that occur when the display device 1000 unfolds after being left in a folding state for about 24 hours with a curvature radius of about 1 mm. The room temperature may be about 25 degrees centigrade, the room humidity may be about 40% humidity, the high temperature may be about 60 degrees centigrade, and the high humidity may be about 90% humidity. A good product reference value for the wrinkle depth may be equal to or less than about 20 m.

When the first, second, and third films 310, 320, and 330 undergo thermal analysis, surface analysis, or chemical analysis, it may be possible to determine whether treatment is performed to enhance physical properties. The thermal analysis may use a thermal analyzer, such as DSC or DMA, to analyze thermal characteristics of films. In addition, the thermal analysis may analyze physical property changes of a crystallization temperature (Tc) and a glass transition temperature (Tg) due to temperature parameters of films. The surface analysis and the chemical analysis may use an apparatus, such as TEM, XPS, or CV, to analyze structural changes, compositional comparison, oxidation-reduction reaction changes, and surface oxidation led by temperature/moisture.

Figure 4:
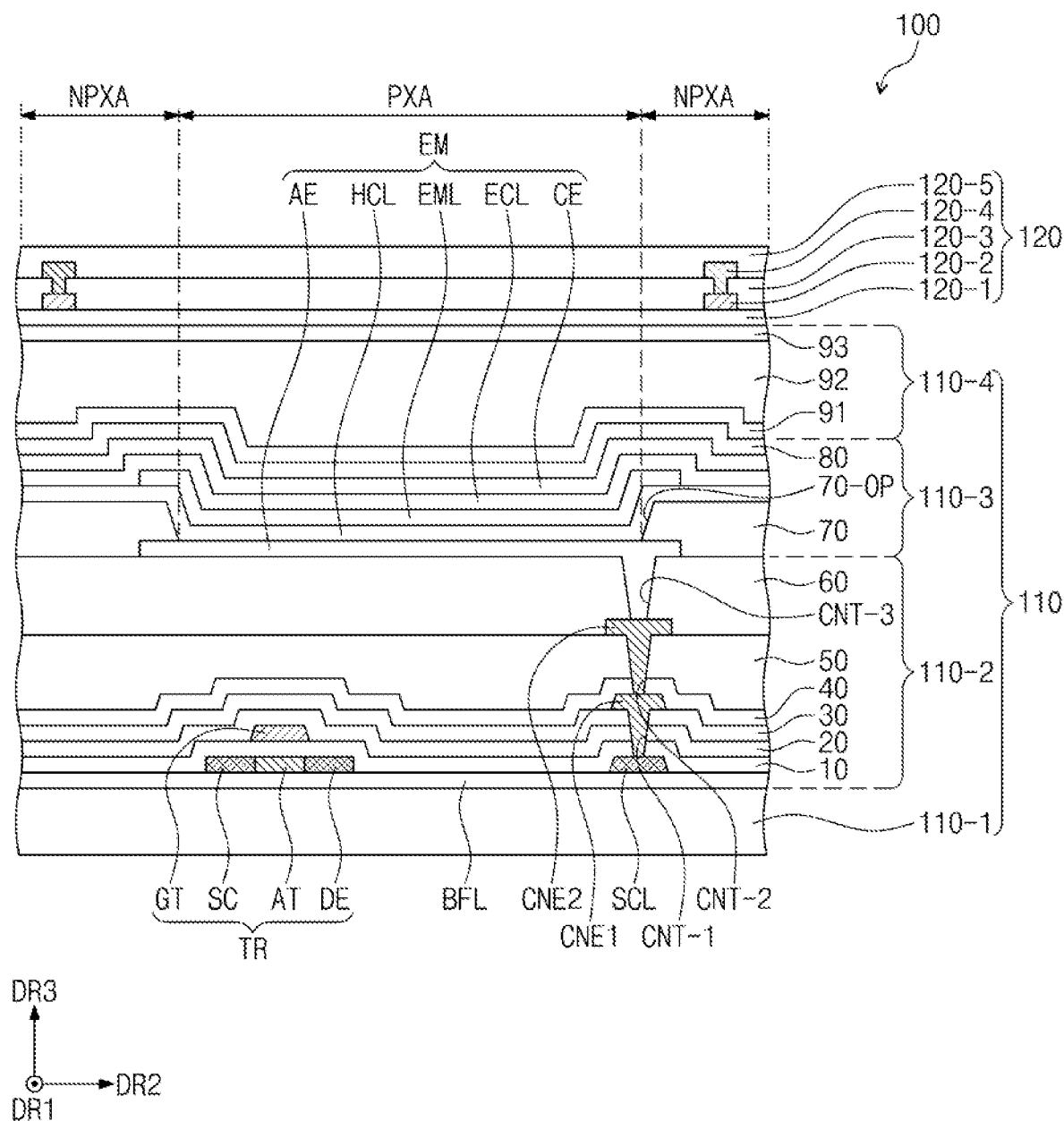
FIG. 4 illustrates across-sectional view showing a display module according to an example embodiment of the present disclosure.

FIG. 4 illustrates a cross-sectional view showing a display module according to an example embodiment of the present disclosure.

Referring to FIG. 4, the display module 100 may include the display panel 110 and the input sensor 120.

The display panel 110 may be a component that generates an image. The display panel 110 may be an emissive display panel. For example, the display panel 110 may be an organic light emitting display panel or a quantum-dot light emitting display panel. The input sensor 120 may be disposed on the display panel 110, and may detect an external input that is externally applied. The external input may be a user's input. The user's input may include, for example, a user's body part, light, heat, pen, pressure, or various other types of external input.

The display panel 110 and the input sensor 120 may be formed in a successive process. In this case, it may be expressed that the input sensor 120 is directly disposed on the display panel 110. The phrase "directly disposed on" may mean that no component is disposed between the input sensor 120 and the display panel 110. For example, no adhesive member may be separately disposed between the input sensor 120 and the display panel 110. For example, the input sensor 120 is directly formed on a base surface of the display panel 110 through a successive process after the display panel 110 is formed.

Instead of forming the input sensor 120 directly on the display panel 110 in a successive process, the display panel 110 and the input sensor 120 may be coupled to each other through an adhesive member. The adhesive member may include an ordinary adhesive or glue. For example, the adhesive member may be a transparent adhesive member, such as, for example, a pressure sensitive adhesive (PSA) film, an optically clear adhesive (OCA) film, or an optically clear resin (OCR).

The display panel 110 may include a base layer 110-1, a plurality of insulating layers, a semiconductor pattern, a conductive pattern, a signal line, and the like. A coating or deposition process may form, on the base layer 110-1, an insulating layer, a semiconductor layer, and a conductive layer. Afterwards, a photolithography process and an etching process may selectively pattern the insulating layer, the semiconductor layer, and the conductive layer. The processes mentioned above may form semiconductor patterns, conductive patterns, and signal lines that are included in a circuit layer 110-2 and a display element layer 110-3. Thereafter, an encapsulation layer 110-4 may be formed to cover the display element layer 110-3.

The base layer 110-1 may include a synthetic resin film. The synthetic resin film may include a thermally curable resin. The base layer 110-1 may have a multi-layered structure. For example, the base layer 110-1 may have a tri-layered structure including a synthetic resin layer, an adhesive layer, and a synthetic resin layer sequentially stacked. The synthetic resin layer may be a polyimide-based resin layer, but the present disclosure is not limited thereto. For example, the synthetic resin layer may include one or more of, for example, acryl-based resin, methacryl-based resin, polyisoprene, vinyl-based resin, epoxy-based resin, urethane-based resin, cellulose-based resin, siloxane-based resin, polyamide-based resin, and perylene-based resin. The base layer 110-1 may include a glass substrate or an organic/inorganic composite substrate.

At least one inorganic layer may be formed on a top surface of the base layer 110-1. The inorganic layer may include one or more of, for example, aluminum oxide ($Al_2O_3$), titanium oxide ($TiO_2$), silicon oxide ($SiO_2$), silicon oxynitride (SiON), zirconium oxide ($ZrO_2$), and hafnium oxide ($HfO_2$). The inorganic layer may be formed multi-layered. The multi-layered inorganic layers may constitute a barrier layer and/or a buffer layer. In the present example embodiment, the display panel 110 is illustrated to include a buffer layer BFL.

The buffer layer BFL increases a bonding force between the base layer 110-1 and a semiconductor pattern, and may block foreign substance or moisture penetrating through the base layer 110-1. The buffer layer BFL may include a silicon oxide ($SiO_2$) layer and/or a silicon nitride ($Si_3N_4$) layer. The silicon oxide ($SiO_2$) layer and the silicon nitride ($Si_3N_4$) layer may be alternately stacked.

A semiconductor pattern is disposed on the buffer layer BFL. The semiconductor pattern may include polysilicon (p-Si). The present disclosure, however, is not limited thereto, and the semiconductor pattern may include, for example, amorphous silicon (a-Si) or oxide semiconductor which includes metal oxide.

FIG. 4 shows only a portion of the semiconductor pattern, and the semiconductor pattern may further be disposed on other regions. The semiconductor pattern may be specifically arranged over pixels. The semiconductor pattern may have different electrical characteristics based on doping, and may include a first region whose conductivity is high and a second region whose conductivity is low. The first region may be doped with n-type or p-type impurities. For example, the n-type impurities may include, for example, phosphorus (P), arsenic (As), or antimony (Sb), and the p-type impurities may include, for example, aluminum (Al), boron (B), or indium (In). A p-type transistor includes a doped region implanted with p-type impurities. The second region may be an undoped region, or may be lightly doped compared to the first region.

The first region has a conductivity greater than that of the second region, and substantially serves as an electrode or a signal line. The second region substantially corresponds to an active region (or a channel region) of a transistor. For example, a portion of the semiconductor pattern may be an active region of a transistor, another portion of the semiconductor pattern may be a source region or drain region of the transistor, and still another portion of the semiconductor pattern may be a connection electrode or a connection signal line.

As shown in FIG. 4, a source region SC, an active region AT, and a drain region DE of a transistor TR may be formed of the semiconductor pattern.

A first insulating layer 10 is disposed on the buffer layer BFL. The first insulating layer 10 commonly overlaps a plurality of pixels, and covers the semiconductor pattern. The first insulating layer 10 may be an inorganic layer and/or an organic layer, and may have a single-layered or multi-layered structure. The first insulating layer 10 may include one or more of, for example, aluminum oxide ($Al_2O_3$), titanium oxide ($TiO_2$), silicon oxide ($SiO_2$), silicon oxynitride (SiON), zirconium oxide ($ZrO_2$), lanthanum oxide ($La_2O_3$), tantalum oxide ($Ta_2O_5$), yttrium oxide ($Y_2O_3$), and hafnium oxide ($HfO_2$). In the present example embodiment, the first insulating layer 10 may be a single-layered silicon oxide ($SiO_2$) layer. Likewise, the first insulating layer 10, an insulating layer of the circuit layer 110-2 may be an inorganic layer and/or an organic layer, and may have a single-layered or multi-layered structure. The inorganic layer may include one or more of the materials mentioned above.

A gate electrode GT of the transistor TR is disposed on the first insulating layer 10. The gate electrode GT may include, for example, doped polysilicon (p-Si), metals, or a combination thereof. For example, the gate electrode GT may be a portion of a metal pattern. The gate electrode GT overlaps the active region AT, and serves as a mask in a process where the semiconductor pattern is doped.

A second insulating layer 20 may be disposed on the first insulating layer 10, and may cover the gate electrode GT. The second insulating layer 20 may be an inorganic layer and/or an organic layer, and may have a single-layered or multi-layered structure. In the present example embodiment, the second insulating layer 20 may be a single-layered silicon oxide ($SiO_2$) layer.

A third insulating layer 30 is disposed on the second insulating layer 20. An electrode layer may be disposed between the second insulating layer 20 and the third insulating layer 30. The third insulating layer 30 may be a single-layered silicon oxide ($SiO_2$) layer.

A first connection electrode CNE1 may be disposed on the third insulating layer 30. The first connection electrode CNE1 may be coupled to a connection signal line SCL through a first contact hole CNT-1 that penetrates the first, second, and third insulating layers 10, 20, and 30.

A fourth insulating layer 40 is disposed on the third insulating layer 30. The fourth insulating layer 40 may be a single-layered silicon oxide ($SiO_2$) layer. A fifth insulating layer 50 is disposed on the fourth insulating layer 40. The fifth insulating layer 50 may be an organic layer including an organic insulating material. The organic insulating material may include, for example, an imide-based polymer, a general-purpose polymer such as polymethylmethacrylate (PMMA) and polystyrene (PS), polymer derivatives having a phenol-based group, an acryl-based polymer, an aryl ether-based polymer, an amide-based polymer, a fluorine-based polymer, a p-xylene-based polymer, a vinyl alcohol-based polymer, or a blend thereof. The fifth insulating layer 50 may provide a planarized top surface. A second connection electrode CNE2 may be disposed on the fifth insulating layer 50. The second connection electrode CNE2 may be coupled to the first connection electrode CNE1 through a second contact hole CNT-2 that penetrates the fourth and fifth insulating layers 40 and 50.

A sixth insulating layer 60 may be disposed on the fifth insulating layer 50, and may cover the second connection electrode CNE2. The sixth insulating layer 60 may be an organic layer including an organic insulating material. The organic insulating material included in the sixth insulating layer 60 may be the same as that of the fifth insulating layer 50, but the present disclosure is not limited thereto.

The circuit layer 110-2 may be provided thereon with the display element layer 110-3 that includes a light emitting element EM. The light emitting element EM may include a first electrode AE, a hole control layer HCL, an emission layer EML, an electron control layer ECL, and a second electrode CE.

The first electrode AE may be disposed on the sixth insulating layer 60, and may be connected to the second connection electrode CNE2 through a third contact hole CNT-3 that penetrates the sixth insulating layer 60.

A pixel definition layer 70 may be disposed on the sixth insulating layer 60, and may cover a portion of the first electrode AE. In an example embodiment of the present disclosure, the pixel definition layer 70 may include, for example, an organic material such as polyimide (PI) or a silicon containing material such as hexamethyldisiloxane (HMDSO). An opening 70-OP is defined in the pixel definition layer 70. The opening 70-OP of the pixel definition layer 70 exposes at least a portion of the first electrode AE.

The display module 100 may have a pixel area PXA and a non-pixel area NPXA adjacent to the pixel area PXA. The non-pixel area NPXA may surround the pixel area PXA. In the present example embodiment, the pixel area PXA is defined to correspond to a portion of the first electrode AE, of which the portion is exposed to the opening 70-OP.

The hole control layer HCL may be disposed on the first electrode AE. In addition, the hole control layer HCL may be disposed in common on the pixel area PXA and the non-pixel area NPXA of the display module 100. The hole control layer HCL may include a hole transport layer and may further include a hole injection layer.

The emission layer EML may be disposed on the hole control layer HCL. In addition, the emission layer EML may be disposed on a region that corresponds to the opening 70-OP. For example, the emission layer EML may be formed on each of pixels, and may generate a color light corresponding to the pixel. The present disclosure, however, is not limited thereto, and the emission layer EML together with the hole control layer HCL may be disposed in common on the pixel area PXA and the non-pixel area NPXA of the display module.

The electron control layer ECL may be disposed on the emission layer EML, and may include an electron transport layer and may further include an electron injection layer. An open mask may be used such that the hole control layer HCL and the electron control layer ECL are formed in common on a plurality of pixels. The second electrode CE is disposed on the electron control layer ECL. The second electrode CE may have a unitary shape and may be disposed in common on a plurality of pixels.

A capping layer 80 is disposed on and in contact with the second electrode CE, and may include an organic material. The capping layer 80 may protect the second electrode CE from a subsequent process, such as sputtering process, and may increase emission efficiency of the light emitting element EM. The capping layer 80 may have a refractive index greater than that of a first inorganic layer 91 which will be discussed.

The encapsulation layer 110-4 may be disposed on the display element layer 110-3. The encapsulation layer 110-4 may include a first inorganic layer 91, an organic layer 92, and a second inorganic layer 93, with the organic layer 92 interposed between the first inorganic layer 91 and the second inorganic layer 93. The organic layer 92 may be in direct contact with the first inorganic layer 91 and the second inorganic layer 93, and may have a substantially flat upper surface. The first inorganic layer 91 and the second inorganic layer 93 may protect the display element layer 110-3 against moisture and/or oxygen, and the organic layer 92 may protect the display element layer 110-3 against foreign substances such as dust particles. A portion of the second inorganic layer 93, located outside the active area 1000-A, may be in direct contact with the first inorganic layer 91, which may prevent the organic layer 92 from being exposed to the outside. The first inorganic layer 91 and the second inorganic layer 93 may each be one of, for example, a silicon nitride ($Si_3N_4$) layer, a silicon oxynitride (SiON) layer, and a silicon oxide ($SiO_2$) layer. In an example embodiment of the present disclosure, the first inorganic layer 91 and the second inorganic layer 93 may each include a titanium oxide ($TiO_2$) layer or an aluminum oxide ($Al_2O_3$) layer. The organic layer 92 may include an acryl-based organic layer, but the present disclosure is not limited thereto.

In an example embodiment of the present disclosure, the capping layer 80 and the first inorganic layer 91 may be provided therebetween with an inorganic layer, for example, a lithium fluoride (LiF) layer. The lithium fluoride (LiF) layer may increase the emission efficiency of the light emitting element EM.

The input sensor 120 may include a base insulating layer 120-1, a first conductive layer 120-2, a sensing insulating layer 120-3, a second conductive layer 120-4, and a cover insulating layer 120-5.

The base insulating layer 120-1 may be directly disposed on the display panel 110. For example, the base insulating layer 120-1 may be in direct contact with the second inorganic layer 93. The base insulating layer 120-1 may have a single-layered or multi-layered structure. Alternatively, the base insulating layer 120-1 may be omitted. Alternatively, the base insulating layer 120-1 may be formed on a separate base layer, and an adhesive member may be used to couple the separate base layer to the display panel 110.

The first conductive layer 120-2 and the second conductive layer 120-4 may each have a single-layered structure or a multi-layered structure in which a plurality of layers are stacked along the third direction DR3. The single-layered conductive layer may include a metal layer or a transparent conductive layer. The metal layer may include, for example, molybdenum (Mo), silver (Ag), titanium (Ti), copper (Cu), aluminum (Al), or an alloy thereof. The transparent conductive layer may include transparent conductive oxide, such as, for example, indium tin oxide (ITO), indium zinc oxide (IZO), zinc oxide (ZnO), or indium zinc tin oxide (IZTO). Additionally or alternatively, the transparent conductive layer may include a metal nano-wire, a graphene, or a conductive polymer such as poly(3,4-ethylenedioxythiophene) (PEDOT).

The multi-layered conductive layer may include a plurality of metal layers. The plurality of metal layers may form a tri-layered structure of, for example, titanium/aluminum/titanium (Ti/Al/Ti). The multi-layered conductive layer may include at least one metal layer and at least one transparent conductive layer.

The first conductive layer 120-2 and the second conductive layer 120-4 may each include patterns that constitute sensing electrodes and signal lines. The input sensor 120 may obtain information about external inputs through a variation in capacitance between the sensing electrodes. The sensing electrodes including the transparent conductive layer are not viewed by a user compared to the sensing electrodes including the metal layer and have an increased input area and thus increase capacitance. In an example embodiment of the present disclosure, to prevent the sensing electrodes including the metal layer from being viewed by a user, the sensing electrodes including the metal layer may have a mesh shape.

The sensing insulating layer 120-3 may be disposed between the first conductive layer 120-2 and the second conductive layer 120-4, and may cover the first conductive layer 120-2. A portion of the second conductive layer 120-4 may be electrically connected to a portion of the first conductive layer 120-2 through a contact hole that penetrates the sensing insulating layer 120-3. The cover insulating layer 120-5 may be disposed on the sensing insulating layer 120-3 and may cover the second conductive layer 120-4.

One or more of the sensing insulating layer 120-3 and the cover insulating layer 120-5 may include an inorganic layer. The inorganic layer may include one or more of, for example, aluminum oxide ($Al_2O_3$), titanium oxide ($TiO_2$), silicon oxide ($SiO_2$), silicon oxynitride (SiON), zirconium oxide ($ZrO_2$), and hafnium oxide ($HfO_2$).

One or more of the sensing insulating layer 120-3 and the cover insulating layer 120-5 may include an organic layer. The organic layer may include one or more of, for example, an acryl-based resin, methacryl-based resin, polyisoprene, a vinyl-based resin, an epoxy-based resin, a urethane-based resin, a cellulose-based resin, a siloxane-based resin, a polyimide-based resin, a polyamide-based resin, and a perylene-based resin.

Figure 5:
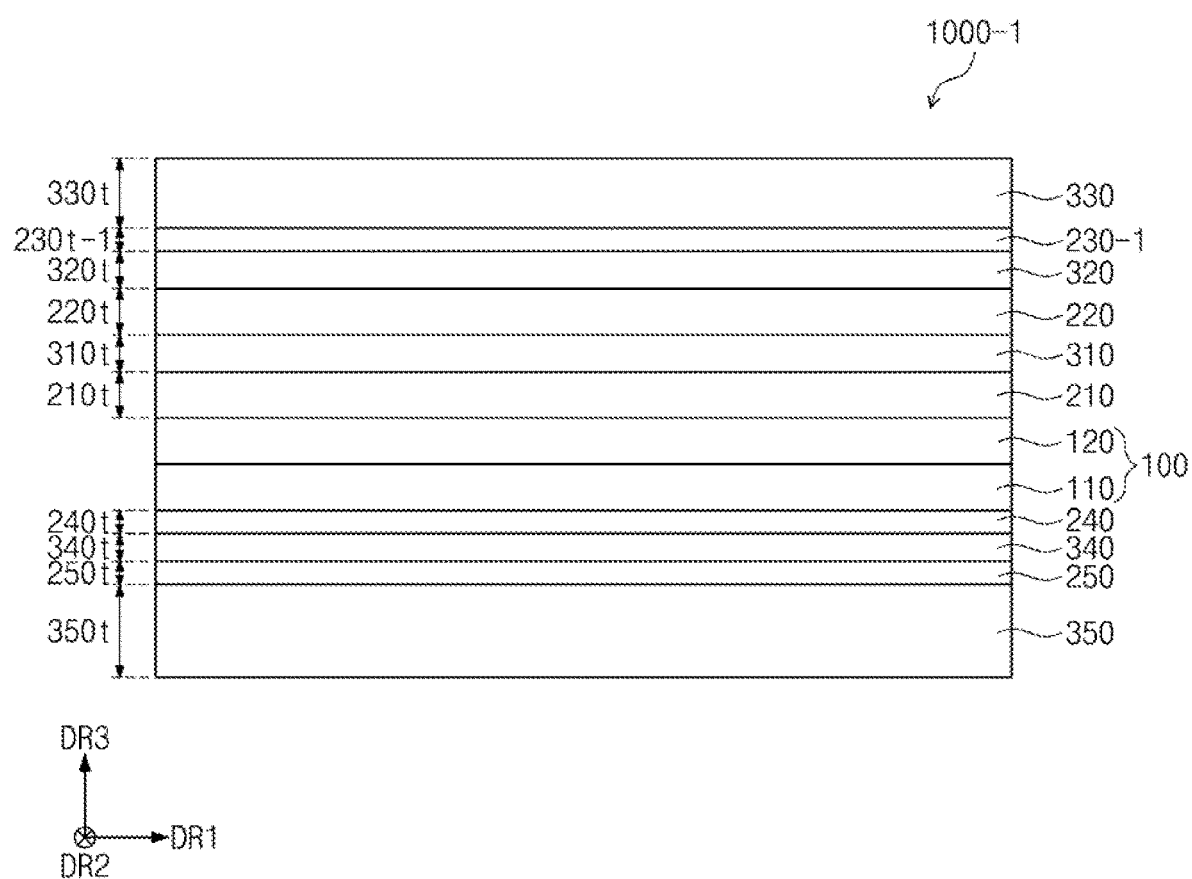
FIG. 5 illustrates a cross-sectional view showing a display device according to an example embodiment of the present disclosure.

FIG. 5 illustrates a cross-sectional view showing a display device according to an example embodiment of the present disclosure.

Referring to FIG. 5, a display device 1000-1 may include a display module 100, first, second, third, fourth, and fifth adhesive layers 210, 220, 230-1, 240, and 250, and first, second, third, fourth, and fifth films 310, 320, 330, 340, and 350.

The first, second, and third adhesive layers 210, 220, and 230-1 may have first, second, and third thicknesses 210$t$, 220$t$, and 230$t$-1, respectively, and the third thickness 230$t$-1 of the third adhesive layer 230-1 disposed at an outer position may be less than each of the first and second thicknesses 210$t$ and 220$t$. For example, each of the first and second thicknesses 210$t$ and 220$t$ may be about 50 μm, and the third thickness 230$t$-1 may be about 25 μm. In the display device 1000-1, similar to the display device 1000, the modulus of the third film 330 according to the present example embodiment may be about 16.67% or less of the modulus of the first film 310, so that the display device 1000-1 may have increased impact resistance and enhanced flexibility properties.

Figure 6:
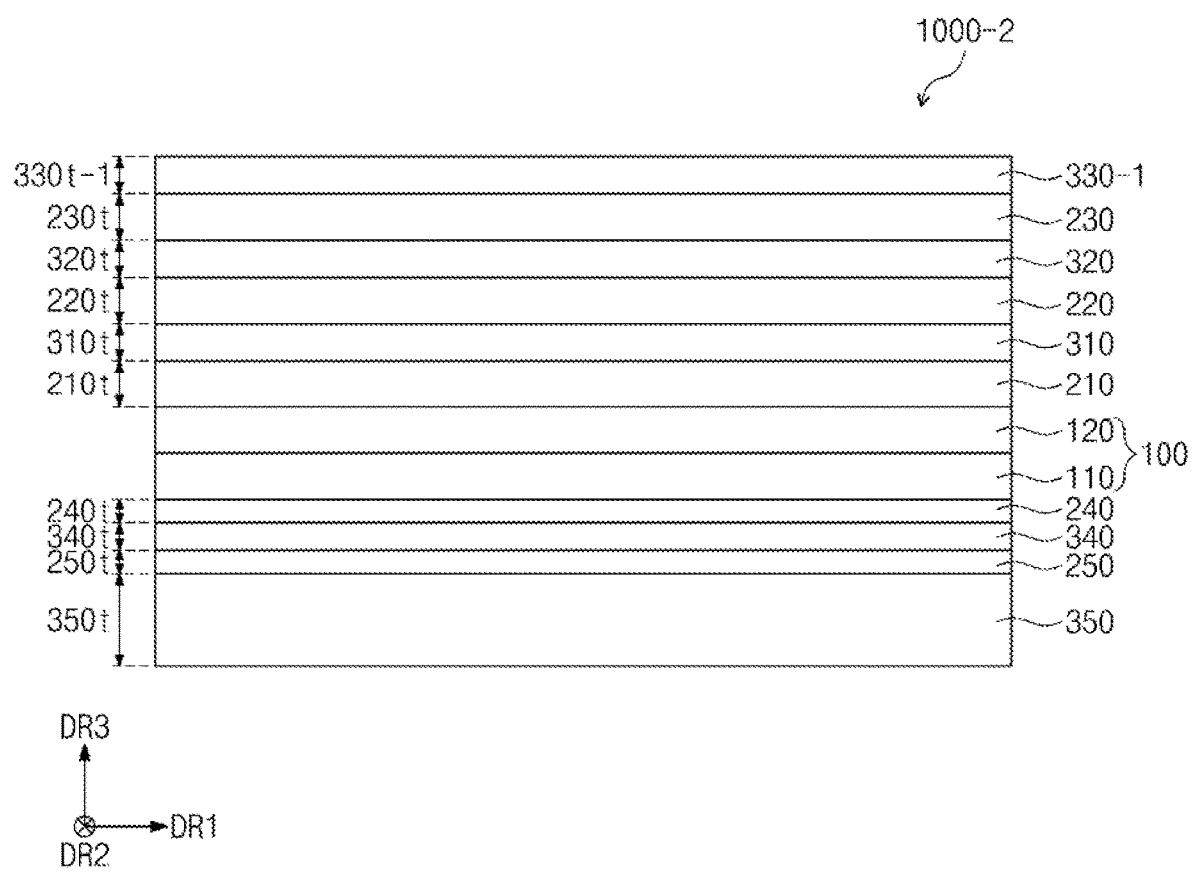
FIG. 6 illustrates a cross-sectional view showing a display device according to an example embodiment of the present disclosure.

FIG. 6 illustrates a cross-sectional view showing a display device according to an example embodiment of the present disclosure.

Referring to FIG. 6, a display device 1000-2 may include a display module 100, first, second, third, fourth, and fifth adhesive layers 210, 220, 230, 240, and 250, and first, second, third, fourth, and fifth films 310, 320, 330-1, 340, and 350.

The first, second, and third films 310, 320, and 330-1 may respectively have first, second, and third thicknesses 310$t$, 320$t$, and 330$t$-1 that are the same as each other. For example, each of the first, second, and third thicknesses 310$t$, 320$t$, and 330$t$-1 may be about 40 m. In the display device 1000-2, similar to the display device 1000, the modulus of the third film 330-1 according to the present example embodiment may be about 16.67% or less of the modulus of the first film 310, so that the display device 1000-2 may have increased impact resistance and enhanced flexibility properties.

According to an example embodiment of the present disclosure, at least three films may be disposed on a display module. Therefore, a display device may increase in impact resistance. Moreover, moduli of the films may gradually decrease with increasing distance from the display module. Accordingly, the display device may enhance in folding properties.

It should be understood that the example embodiments described herein should be considered in a descriptive sense only and not for purposes of limitation. Although specific example embodiments have been described with reference to a number of illustrative examples thereof, it will be understood by those of ordinary skill in the art that various changes in form and details may be made without departing from the spirit and scope of the present disclosure as defined in the appended claims.

What is claimed is:

1. A display device, comprising:
   a display module that has at least one folding area;
   a first film disposed on the display module and having a first Young's modulus;
   a second film disposed on the first film, being farther from the display module than the first film, and having a second Young's modulus less than the first Young's modulus; and
   a third film disposed on the second film, being farther from the display module than the second film, and having a third Young's modulus less than the second Young's modulus,
   wherein the third Young's modulus is equal to or less than about one-sixth of the first Young's modulus.

2. The display device of claim 1, wherein the third Young's modulus is equal to or greater than about 1.5 percent and equal to or less than about 16.67 percent of the first Young's modulus.

3. The display device of claim 1, wherein the second Young's modulus is equal to or greater than about 50 percent and less than about 100 percent of the first Young's modulus.

4. The display device of claim 1, wherein the first film is a composite material including one or more of polyimide (PI), aramid, glass fiber, glass chopped strand, and cellulose fiber.

5. The display device of claim 1, wherein the second film includes polyethylene terephthalate (PET), acryl, polycarbonate (PC), polyethylene naphthalate (PEN), or triacetyl cellulose (TAC).

6. The display device of claim 1, wherein the third film includes polyamide (PA), polymethylmethacrylate (PMMA), polyether block amide (PEBA)-based polymer, a silicone-based polymer, or a urethane-based polymer.

7. The display device of claim 1, wherein a thickness of the third film is greater than a thickness of the first film and a thickness of the second film,
   wherein the thickness of the first film and the thickness of the second film are the same as each other.

8. The display device of claim 1, further comprising:
   a first adhesive layer interposed between the display module and the first film;
   a second adhesive layer interposed between the first film and the second film; and
   a third adhesive layer interposed between the second film and the third film.

9. The display device of claim 8, wherein
   a thickness of the first adhesive layer, a thickness of the second adhesive layer, and a thickness of the third adhesive layer are the same as each other, or
   a thickness of the third adhesive layer is less than a thickness of the first adhesive layer and a thickness of the second adhesive layer.

10. The display device of claim 8, wherein, at a certain temperature, an adhesive force of the second adhesive layer is less than an adhesive force of the first adhesive layer and an adhesive force of the third adhesive layer.

11. The display device of claim 8, further comprising:
    a fourth adhesive layer disposed below the display module; and a fourth film disposed below the fourth adhesive layer and having a fourth Young's modulus less than the first Young's modulus.

12. The display device of claim 11, further comprising:
a fifth adhesive layer disposed below the fourth film; and
a fifth film disposed below the fifth adhesive layer and having a fifth Young's modulus less than the first Young's modulus.

13. The display device of claim 12, wherein
the fifth Young's modulus is less than the fourth Young's modulus, and
a thickness of the fifth film is greater than a thickness of the fourth film.

14. The display device of claim 1, wherein each of the first film and the second film includes a film that satisfies a condition that yield strain is about 1.9% to about 2.5%, plastic deformation index is about 0.58 to about 1, recovery rate is about 80% to about 100%, and strain rate is about 0% to about 30%.

15. The display device of claim 1, wherein the third film includes a film that satisfies a condition that yield strain is about 1.9% to about 2.5%, plastic deformation index is about 0.58 to about 1, recovery rate is about 80% to about 100%, and strain rate is about 0% to about 100%.

16. A display device, comprising:
a display module that has at least one folding area;
a first film disposed on the display module and having a first Young's modulus;
a second film disposed on the first film, being farther from the display module than the first film, and having a second Young's modulus different from the first Young's modulus;
a third film disposed on the second film, being farther from the display module than the second film, and having a third Young's modulus different from the first Young's modulus and the second Young's modulus;
a first adhesive layer interposed between the display module and the first film;
a second adhesive layer interposed between the first film and the second film; and
a third adhesive layer interposed between the second film and the third film,
wherein, at a certain temperature, one or more of an adhesive force of the second adhesive layer and an adhesive force of the third adhesive layer are less than an adhesive force of the first adhesive layer, and the third Young's modulus is equal to or less than about one-sixth of the first Young's modulus.

17. The display device of claim 16, wherein
the second Young's modulus is less than the first Young's modulus,
the second Young's modulus is greater than the third Young's modulus, and
the third Young's modulus is equal to or greater than about 1.5 percent and equal to or less than about 16.67 percent of the first Young's modulus.

18. The display device of claim 16, further comprising:
a fourth film disposed below the display module and having a fourth Young's modulus less than the first Young's modulus; and
a fifth film disposed below the fourth film and having a fifth Young's modulus less than the fourth Young's modulus,
wherein a thickness of the fifth film is greater than a thickness of the fourth film.

19. The display device of claim 16, wherein
a thickness of the first film and a thickness of the second film are the same as each other, and
a thickness of the third film is greater than the thickness of the first film and the thickness of the second film.

20. The display device of claim 16, wherein
the first film is a composite material including one or more of polyimide (PI), aramid, glass fiber, glass chopped strand, and cellulose fiber,
the second film includes polyethylene terephthalate (PET), acryl, polycarbonate (PC), polyethylene naphthalate (PEN), or triacetyl cellulose (TAC), and
the third film includes polyamide (PA), polymethylmethacrylate (PMMA), polyether block amide (PEBA)-based polymer, a silicone-based polymer, or a urethane-based polymer.

21. The display device of claim 16, wherein
each of the first film and the second film includes a film that satisfies a condition that yield strain is about 1.9% to about 2.5%, plastic deformation index is about 0.58 to about 1, recovery rate is about 80% to about 100%, and strain rate is about 0% to about 30%, and
the third film includes a film that satisfies a condition that yield strain is about 1.9% to about 2.5%, plastic deformation index is about 0.58 to about 1, recovery rate is about 80% to about 100%, and strain rate is about 0% to about 100%.

* * * * *